United States Patent
Frosien et al.

(10) Patent No.: US 10,453,645 B2
(45) Date of Patent: Oct. 22, 2019

(54) METHOD FOR INSPECTING A SPECIMEN AND CHARGED PARTICLE MULTI-BEAM DEVICE

(71) Applicants: APPLIED MATERIALS ISRAEL LTD., Rehovot (IL); Technische Universiteit Delft, Delft (NL)

(72) Inventors: Jürgen Frosien, Riemerling (DE); Pieter Kruit, Delft (NL)

(73) Assignees: APPLIED MATERIALS ISRAEL LTD., Rehovot (IL); TECHNISCHE UNIVERSITEIT DELFT, CN Delft (NL)

( * ) Notice: Subject to any disclaimer, the term of this patent is extended or adjusted under 35 U.S.C. 154(b) by 380 days.

(21) Appl. No.: 15/366,482

(22) Filed: Dec. 1, 2016

(65) Prior Publication Data

US 2018/0158642 A1   Jun. 7, 2018

(51) Int. Cl.
  *H01J 37/10*   (2006.01)
  *H01J 37/09*   (2006.01)
  (Continued)

(52) U.S. Cl.
  CPC ............ *H01J 37/10* (2013.01); *H01J 37/09* (2013.01); *H01J 37/153* (2013.01);
  (Continued)

(58) Field of Classification Search
  CPC .......... H01J 37/10; H01J 37/09; H01J 37/153; H01J 37/226; H01J 37/28;
  (Continued)

(56) References Cited

U.S. PATENT DOCUMENTS

| 9,922,796 B1 * | 3/2018 | Frosien ................. H01J 37/09 |
| 10,176,965 B1 * | 1/2019 | Breuer .................. H01J 37/153 |

(Continued)

OTHER PUBLICATIONS

Crewe, A.V., Parker, N.W., "Correction of Third-Order Aberrations in the Scanning Electron Microscope", Optik, vol. 46, 1976, pp. 183-194.

(Continued)

*Primary Examiner* — Nicole M Ippolito
(74) *Attorney, Agent, or Firm* — Lowenstein Sandler LLP (57) ABSTRACT

A method of inspecting a specimen with an array of primary charged particle beamlets in a charged particle beam device is described. The method includes generating a primary charged particle beam with a charged particle beam emitter; illuminating a multi-aperture lens plate with the primary charged particle beam to generate the array of primary charged particle beamlets; correcting a field curvature with at least two electrodes, wherein the at least two electrodes include aperture openings; directing the primary charged particle beamlets with a lens towards an objective lens; guiding the primary charged particle beamlets through a deflector array arranged within the lens; wherein the combined action of the lens and the deflector array directs the primary charged particle beamlets through a coma free point of the objective lens; and focusing the primary charged particle beamlets on separate locations on the specimen with the objective lens.

20 Claims, 6 Drawing Sheets

(51) Int. Cl.
*H01J 37/22* (2006.01)
*H01J 37/28* (2006.01)
*H01J 37/153* (2006.01)

(52) U.S. Cl.
CPC ............ *H01J 37/226* (2013.01); *H01J 37/28* (2013.01); *H01J 2237/0453* (2013.01); *H01J 2237/0475* (2013.01); *H01J 2237/0492* (2013.01); *H01J 2237/103* (2013.01); *H01J 2237/1534* (2013.01); *H01J 2237/1536* (2013.01); *H01J 2237/2817* (2013.01)

(58) Field of Classification Search
CPC ....... H01J 2237/0453; H01J 2237/0475; H01J 2237/0492; H01J 2237/1536; H01J 2237/2817

USPC ............ 250/306, 307, 309, 310, 311, 492.1, 250/492.2, 492.21, 492.23, 492.3
See application file for complete search history.

(56) References Cited

U.S. PATENT DOCUMENTS

| | | |
|---|---|---|
| 2010/0072387 A1 | 3/2010 | Sawada et al. |
| 2015/0155134 A1 | 6/2015 | Frosien et al. |
| 2016/0284505 A1 | 9/2016 | Ren et al. |
| 2016/0336142 A1 | 11/2016 | Liu et al. |

OTHER PUBLICATIONS

International Search Report and Written Opinion for International Application No. PCT/EP2017/080506 dated Feb. 22, 2018, 17 pages.

\* cited by examiner

METHOD FOR INSPECTING A SPECIMEN AND CHARGED PARTICLE MULTI-BEAM DEVICE

TECHNICAL FIELD

Embodiments relate to charged particle beam devices, for example, for inspection system applications, testing system applications, defect review or critical dimensioning applications or the like. Embodiments also relate to methods of operation of a charged particle beam device. More particularly, embodiments relate to charged particle beam devices being multi-beam systems for general purposes (such as imaging biological structures) and/or for high throughput EBI (electron beam inspection). Specifically, embodiments relate to a scanning charged particle beam device and a method of electron beam inspection with a scanning charged particle beam device.

BACKGROUND

Modern semiconductor technology is highly dependent on an accurate control of the various processes used during the production of integrated circuits. Accordingly, the wafers are inspected repeatedly in order to localize problems as early as possible. Furthermore, a mask or reticle is also inspected before the actual use during wafer processing in order to make sure that the mask accurately defines the respective pattern. The inspection of wafers or masks for defects includes the examination of the whole wafer or mask area. Especially, the inspection of wafers during their fabrication includes the examination of the whole wafer area in such a short time that production throughput is not limited by the inspection process.

Scanning electron microscopes (SEM) have been used to inspect wafers. The surface of the wafer is scanned using e.g. a single finely focused electron beam. When the electron beam hits the wafer, secondary electrons and/or backscattered electrons, i.e. signal electrons, are generated and measured. A pattern defect at a location on the wafer is detected by comparing an intensity signal of the secondary electrons to, for example, a reference signal corresponding to the same location on the pattern. However, because of the increasing demands for higher resolutions, scanning the entire surface of the wafer takes a long time. Accordingly, using a conventional (single-beam) Scanning Electron Microscope (SEM) for wafer inspection is difficult, since the approach does not provide the respective throughput.

Wafer and mask defect inspection in semiconductor technology needs high resolution and fast inspection tools, which cover both full wafer/mask application or hot spot inspection. Electron beam inspection gains increasing importance because of the limited resolution of light optical tools, which are not able to handle the shrinking defect sizes. In particular, from the 20 nm node and beyond, the high-resolution potential of electron beam based imaging tools is in demand to detect all defects of interest.

In view of the above, a charged particle multi-beam device and a method for inspecting a specimen with an array of beamlets of charged particles is provided that overcome at least some of the problems in the art.

SUMMARY

In light of the above, a method for inspecting a specimen with an array of beamlets of charged particles and a charged particle multi-beam device according to the independent claims are provided. Further aspects, advantages, and features are apparent from the dependent claims, the description, and the accompanying drawings.

According to one embodiment, a method of inspecting a specimen with an array of primary charged particle beamlets in a charged particle beam device is provided. The method includes generating a primary charged particle beam with a charged particle beam emitter of a charged particle beam source; illuminating a multi-aperture lens plate with the primary charged particle beam to generate the array of primary charged particle beamlets which are focused; correcting a field curvature of the charged particle beam device with at least two electrodes, wherein the at least two electrodes comprise aperture openings; directing the primary charged particle beamlets with a lens towards an objective lens of the charged particle beam device; guiding the primary charged particle beamlets through a deflector array arranged within the lens; wherein the combined action of the lens and the deflector array directs the primary charged particle beamlets through a coma free point of the objective lens of the charged particle beam device; and focusing the primary charged particle beamlets on separate locations on the specimen with the objective lens to simultaneously inspect the specimen at the separate locations.

According to another embodiment, a charged particle beam device for inspection of a specimen with an array of primary charged particle beamlets is provided. The charged particle beam includes a charged particle beam source for generating an array of primary charged particle beamlets, wherein the charged particle beam source comprises a charged particle beam emitter for emitting a charged particle beam, a multi-aperture lens plate comprising at least two openings to generate and focus an array of primary charged particle beamlets, the multi-aperture lens plate being arranged for being illuminated with the primary charged particle beam; a field curvature correction device for correcting a field curvature of the charged particle beam device, wherein the field curvature correction device comprises at least two field curvature correction electrodes having aperture openings through which the primary charged particle beam or the primary charged particle beamlets pass; a lens configured for directing the array of primary charged particle beamlets to an objective lens of the charged particle beam device; a deflector array arranged within the lens, wherein the lens and the deflector array are configured for directing the primary charged particle beamlets through a coma free point of an objective lens by the combined action of the lens and the deflector array; and an objective lens for decelerating and focusing each primary charged particle beamlet of the array of primary charged particle beamlets to a separate location on the specimen.

According to another embodiment, a multi-column microscope configuration with at least two charged particle beam devices configured to image a specimen is provided. Each of the at least two charged particle beam devices comprise a charged particle beam source for generating an array of primary charged particle beamlets, wherein the charged particle beam source comprises a charged particle beam emitter for emitting a charged particle beam, a multi-aperture lens plate comprising at least two openings to generate an array of primary charged particle beamlets, the multi-aperture lens plate being arranged for being illuminated with the primary charged particle beam; a field curvature correction device for correcting a field curvature of the charged particle beam device, wherein the field curvature correction device comprises at least two field curvature correction electrodes having aperture openings through which the primary charged particle beam passes; a lens configured for directing the array of primary charged particle beamlets towards an objective lens of the charged particle beam device; and a deflector array arranged within the lens; wherein the lens and the deflector array are configured for directing the primary charged particle beamlets through a coma free point of an objective lens by the combined action of the lens and the deflector array, wherein the multi-column microscope configuration further comprises an objective lens for decelerating and focusing each primary charged particle beamlet to a separate location on the specimen.

Embodiments are also directed at apparatuses for carrying out the disclosed methods and include apparatus parts for performing each described method features. The method features may be performed by way of hardware components, a computer programmed by appropriate software, by any combination of the two or in any other manner. Furthermore, embodiments are also directed at methods which the described apparatus operates with. Embodiments include method features for carrying out every function of the apparatus.

BRIEF DESCRIPTION OF THE DRAWINGS

So that the manner in which the above recited features can be understood in detail, a more particular description, briefly summarized above, may be had by reference to embodiments. The accompanying drawings relate to embodiments and are described in the following.

DETAILED DESCRIPTION OF EMBODIMENTS

Reference will now be made in detail to the various embodiments, one or more examples of which are illustrated in the figures. Within the following description of the drawings, the same reference numbers refer to same components. The differences with respect to individual embodiments are described. Each example is provided by way of explanation and is not meant as a limitation. Further, features illustrated or described as part of one embodiment can be used on or in conjunction with other embodiments to yield yet a further embodiment. The description is intended to include the modifications and variations.

Without limiting the scope of protection of the present application, in the following the charged particle beam device or components thereof will exemplarily be referred to as a charged particle beam device including the detection of secondary or backscattered particles, such as electrons. Embodiments can still be applied for apparatuses and components detecting corpuscles, such as secondary and/or backscattered charged particles in the form of electrons or ions, photons, X-rays or other signals in order to obtain a specimen image. When referring to corpuscles, the corpuscles are to be understood as light signals in which the corpuscles are photons as well as particles, in which the corpuscles are ions, atoms, electrons or other particles. As described herein, discussions and descriptions relating to the detection are exemplarily described with respect to electrons in scanning electron microscopes. Other types of charged particles, e.g. positive ions, could be detected by the device in a variety of different instruments.

According to embodiments herein, which can be combined with other embodiments, a signal (charged particle) beam, or a signal (charged particle) beamlet is referred to as a beam of secondary particles, i.e. secondary and/or backscattered particles. Typically, the signal beam or secondary beam is generated by the impingement of the primary beam or primary beamlet on a specimen or by backscattering of the primary beam from the specimen. A primary charged particle beam or a primary charged particle beamlet is generated by a particle beam source and is guided and deflected on a specimen to be inspected or imaged.

A "specimen" or "sample" as referred to herein, includes, but is not limited to, semiconductor wafers, semiconductor workpieces, photolithographic masks and other workpieces such as memory disks and the like. Embodiments may be applied to any workpiece on which material is deposited or which is structured. A specimen includes a surface to be structured or on which layers are deposited, an edge, and typically a bevel. According to some embodiments, which can be combined with other embodiments described herein, the apparatus and methods are configured for or are applied for electron beam inspection, for critical dimensioning applications and defect review applications.

Figure 1:
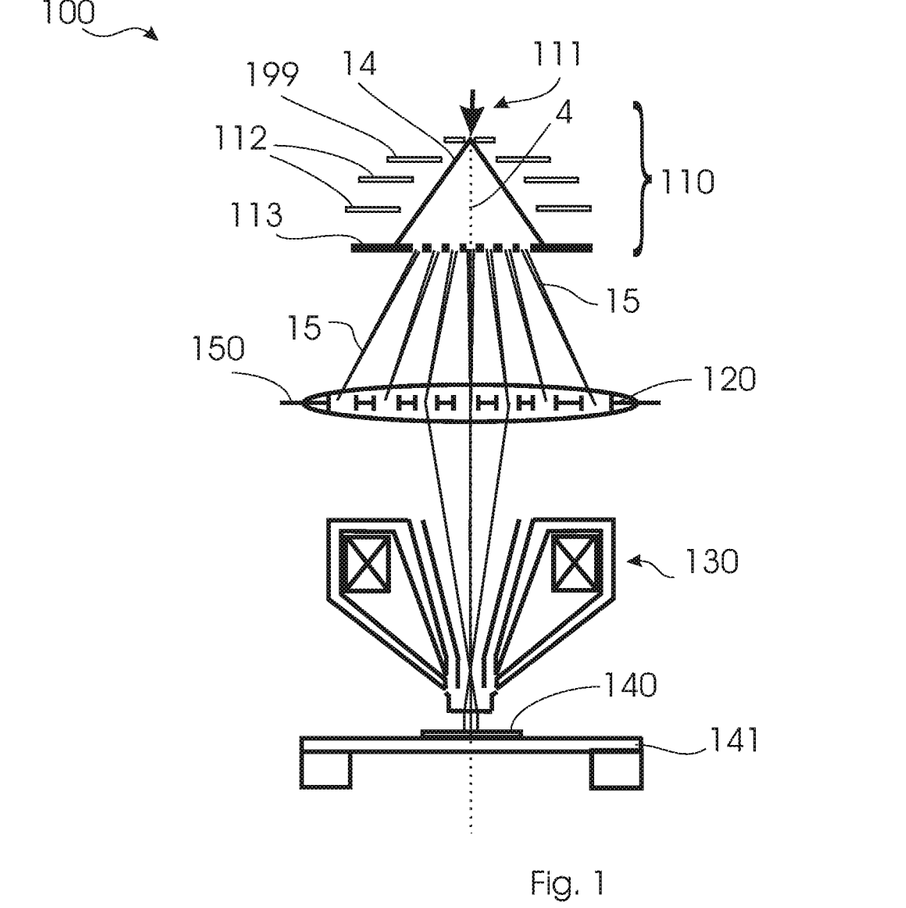
FIG. 1 shows a schematic drawing of a multi-beam device for specimen inspection according to embodiments described herein.

An embodiment of a charged particle beam device is shown schematically in FIG. 1. The charged particle beam device 100 includes a charged particle beam source 110 including a beam emitter 111, which emits a primary charged particle beam 14. According to embodiments described herein, the charged particle beam source 110 is adapted for generating an array of primary charged particle beamlets 15. The charged particle beam source 110 may include the charged particle beam emitter 111, and a multi-aperture lens plate 113. In some embodiments, the primary charged particle beam 14 may be accelerated by an accelerating voltage supplied to the acceleration electrode 199 (voltage difference between the charged particle beam emitter 111 and the acceleration electrode 199). According to embodiments described herein, the charged particle beam device includes field curvature correction electrodes 112 (exemplarily shown two field curvature correction electrodes). In the embodiment of FIG. 1 (and also the following FIGS. 2, 3a and 3b), the field curvature correction electrodes 112 are exemplarily shown placed between the charged particle beam emitter 111 and the multi-aperture lens plate 113.

A charged particle beam emitter as described herein may be a cold field emitter (CFE), a Schottky emitter, a TFE or another high current high brightness charged particle beam source (such as an electron beam source). A high current is considered to be 5 μA in 100 mrad or above, for example up to 5 mA, e.g. 30 μA in 100 mrad to 1 mA in 100 mrad, such as about 300 µA in 100 mrad. According to some implementations, the current is distributed essentially uniform, e.g. with a deviation of +−10%, particularly in the case of a linear or rectangular array. According to some embodiments, which can be combined with other embodiments described herein, the primary charged particle beam source or the source of the primary charged particle beamlets can have a diameter of 2 nm to 100 nm.

According to yet further embodiments, which can be combined with other embodiments described herein, a TFE or another high reduced-brightness source, e.g. an electron-beam source, capable of providing a large beam current is a source where the brightness does not fall by more than 20% of the maximum value when the emission angle is increased to provide a maximum of 10 µA-100 µA, for example 30 µA.

Schottky or TFE emitters are currently available with a measured reduced-brightness of $5 \cdot 10^7$ $Am^{-2}(SR)^{-1}V^{-1}$, CFE emitters have a measured reduced-brightness of up to $5 \cdot 10^9$ $Am^{-2}(SR)^{-1}V^{-1}$. The charged particle beam device may also work with a carbide emitter such as HfC which can have a reduced brightness of approximately $1 \cdot 10^{11}$ $Am^{-2}(SR)^{-1}V^{-1}$. For example, a charged particle beam, which has at least $5 \cdot 10^7$ $Am^{-2}(SR)^{-1}V^{-1}$ is beneficial.

According to some embodiments, at least two field curvature correction electrodes may be provided. In the examples shown in the figures, two field curvature correction electrodes are shown. The field curvature correction electrode(s) may be driven to decelerate the primary charged particle beam 14 in the embodiment shown in FIG. 1 (and also in the embodiments shown in FIGS. 2, 3a, and 3b). The field curvature correction electrodes may be arranged between the charged particle beam emitter 111 and the multi-aperture lens plate 113. The field curvature correction electrodes 112 may have aperture openings through which the primary charged particle beam 14 can pass.

The at least two field curvature correction electrodes as described in embodiments herein may be used for compensating or correcting the field curvature of the charged particle beam device, in particular the field curvature introduced by imaging lenses of the charged particle beam device. In some embodiments, the at least two field curvature correction electrodes may be used for compensating or correcting the field curvature introduced by the imaging lenses of the charged particle beam device being arranged downstream of the multi-aperture lens plate of the charged particle beam device, when seen in a direction of the propagating primary charged particle beam, or the primary charged particle beamlets. In particular, the at least two field curvature correction electrodes may be used for compensating or correcting the field curvature introduced by the objective lens of the charged particle beam device, as will be explained in detail below.

According to some embodiments, which may be combined with other embodiments described herein, the field curvature correction electrode(s) may be adjustable, adaptable and/or controllable (e.g. by a controller) to compensate the field curvature introduced by one or more lenses of the charged particle beam device. In particular, the field curvature correction electrodes may be adjustable to the respective operation of the charged particle beam device, to the intended use of the charged particle beam device, or to changing lens configurations and lens strengths, which may be used in the charged particle beam device. For instance, the voltage supplied to the field curvature correction electrodes may be adjustable, e.g. by a control unit and a respective control system (such as signal lines from the control unit to the voltage supply of the field curvature correction electrodes).

As mentioned above, and according to some embodiments, the field curvature correction may be provided and performed by field curvature correction electrodes. For instance, the field curvature correction electrodes may be two macro electrodes. In some embodiments, the charged particle beam emitter of the charged particle beam source may include one or more extractor electrodes for providing an extraction voltage to the primary charged particle beam. Together with the multi-aperture lens plate and the extractor electrodes, the field curvature correction electrodes and the extraction electrode may create a so called "zero-strength macro lens". "Zero strength" may mean that the charged particles are not deflected; avoiding the problem associated with chromatic deflection errors. According to some embodiments, the field curvature correction electrodes may be configured and/or controlled so that the field from the field curvature correction electrodes may end on the multi-aperture lens plate, forming low aberration single aperture lenses for the single primary charged particle beamlets.

In the embodiment of FIG. 1 (and also the embodiments shown in FIGS. 2, 3a, and 3b), the primary charged particle beam 14 can pass through the multi-aperture lens plate 113 after having left the charged particle emitter 111, and after having passed the field curvature correction electrodes 112. The primary charged particle beam 14 can pass through the multi-aperture lens plate 113 having multiple aperture openings and may be focused into beamlets by the leaking deceleration field. The aperture openings can be situated in any array configuration on the multi-aperture lens plate 113 such as a line, rectangle, a square, a ring, or any suitable one-dimensional or two-dimensional array. According to embodiments described herein, the charged particle beam device as described herein allows to array the aperture openings of the multi-aperture lens plate in any configuration without having drawbacks due to field curvature or aberrations. For instance, known systems arrange the different beamlets in a ring-like shape for providing the same conditions for every beam passing a lens acting like a parabola. When arranging the beamlets on a ring-like shape, the field curvature influence of the respective lens can be minimized. With the charged particle beam device according to embodiments described herein, the arrangement of the beamlet array may be done in any arrangement, e.g. an arrangement suitable for fast inspection, an arrangement adapted to the specimen structure to be inspected, an arrangement allowing a large number of beams, an arrangement adapted to the beam intensity and the like. For example, the beamlet array may be arranged in a line, a rectangle or a square.

By illuminating the multi-aperture lens plate 113 with the primary charged particle beam 14, several focused primary charged particle beamlets 15 are created by using the deceleration field in front of the aperture plate. In the focus plane of the primary charged particle beamlets 15, a lens 120 may be arranged. According to some embodiments, the lens 120 may be an acceleration lens, in particular in the case, where the field curvature correction electrodes are driven in a decelerating mode and are arranged in front of the multi-aperture lens plate (when seen in a direction of the propagating primary charged particle beam). In some embodiments, the lens 120 being provided as an acceleration lens (or in other embodiments as a deceleration lens) may be an electrostatic or a combined magnetic-electrostatic lens.

In the figures, some of the primary charged particle beamlets of the array of primary charged particle beamlets are shown after the lens, while other primary charged particle beamlets are omitted in the drawings for the sake of a better overview. According to some embodiments described herein, the multi-aperture lens plate having aperture openings is provided for generating real sources for the primary charged particle beamlets.

In some embodiments, the multi-aperture lens plate 113 may directly be illuminated by the charged particle beam emitter 111. According to some embodiments, "directly" may mean that—apart from the field curvature correction electrodes in embodiments having the field curvature correction electrodes in front of the multi-aperture lens plate (when seen in a direction of the propagating primary charged particle beam)—no additional optical elements are provided between the charged particle beam emitter 111 and the multi-aperture lens plate. The multi-aperture lens plate splits the primary charged particle beam 14 emitted from the charged particle beam emitter into an array of primary charged particle beamlets 15. For instance, the multi-aperture lens plate has at least three aperture openings for splitting the primary charged particle beam into at least three primary charged particle beamlets. In the example shown in FIG. 1, seven primary charged particle beamlets 15 are shown in the schematic view. In some embodiments, the array of primary charged particle beamlets may be arranged in a one dimensional (line) arrays or 2-dimensional arrays (e.g. 4×4, 3×3, 5×5) or asymmetrical arrays e.g. 2×5. Embodiments described herein are not limited to the examples of arrays and may include any suitable array configuration of primary charged particle beamlets.

The described multi-aperture lens plate can be beneficially used in other embodiments relating to charged particle beam device, systems including arrays of charged particle beam devices and methods of operating charged particle beam devices. The design of the multi-aperture lens plate beneficially follows different criteria and has to be treated in the context of the overall charged particle optical ray path design. In some embodiments, which may be combined with other embodiments described herein, a multi-aperture lens plate may be provided with one or more of the following features. The number of aperture openings is a compromise between largest possible total current and optical performance, in particular achievable spot size in the largest possible beamlet field. Another boundary condition is the beamlet separation on the specimen, which assures a signal beamlet separation on the detectors, wherein crosstalk is reduced or avoided. According to yet further embodiments, which can be combined with other embodiments described herein, the grid configuration (i.e. the positions of the primary beamlets on the specimen and/or the positions of the aperture openings in the aperture plate) is provided to allow for a complete coverage of the substrate surface during a scan. The coverage is not limited to a pure charged particle beamlet scan, e.g. in the x-y-direction, but also includes a mixed scan operation like charged particle beamlet scan, e.g. in a first direction, such as the x-direction, and a stage movement in another direction different from the first direction, such as the y-direction.

According to embodiments described herein, the primary charged particle beamlets 15 are directed towards the lens 120. For instance, the lens 120 may be an acceleration lens for accelerating the primary charged particle beamlets 15 propagating from the multi-aperture lens plate. In some embodiments (such as the embodiments shown in FIGS. 1, 2, 3a, and 3b), the lens is placed directly after the multi-aperture lens plate 113 in direction of the propagating array of primary charged particle beamlets. The term "directly" in the context may mean that no additional beam optical elements are arranged between the multi-aperture lens plate and the lens. The lens 120 may be used for accelerating the primary charged particle beamlets 15 to a high column voltage in an embodiment, where the field curvature correction electrodes are placed before the multi-aperture lens plate in a direction of the propagating primary charged particle beam. For instance, the acceleration lens may accelerate the primary charged particle beamlets to a column voltage of typically 10 kV or above, and more typically 20 kV or above. The accelerating voltage may determine the velocity at which the charged particles of the charged particle beamlets travel down the column. In one example, the acceleration lens may be an electrostatic lens. According to embodiments described herein, the acceleration lens may direct the primary charged particle beamlets to (or near) a coma free point of an objective lens of the charged particle beam device.

According to some embodiments, which are described in detail below, a deflector array 150 is arranged within or near the lens. According to some embodiments, the deflector array being arranged "in or near" or "within" the lens may be understood in that the deflector array is placed within the focal length of the lens. In particular, the deflector array may be placed within the lens. For instance, the lens may include three electrodes and the deflector array may be placed within the three electrodes. According to some embodiments, the deflector array may approximately be placed at the height of the middle electrode of the three electrodes of the lens.

According to some embodiments, the lens may be used for achieving the main effect of directing of the primary charged particle beamlets, especially for directing the primary charged particle beamlets to the coma free point of the objective lens. The deflector array 150 may be used for fine adjustment of the individual primary charged particle beamlets, especially the fine adjustment of the primary charged particle beamlets to be guided into or through the coma free point of the objective lens. The lens and the deflector array being configured for guiding the primary charged particle beamlets to the coma free point of the objective lens may be understood in that the focal length of the lens, the voltage supplied to the lens, the voltage supplied to the deflector array, the size of the deflector array, the size of the single deflectors of the deflector arrays may be chosen for guiding the primary charged particle beamlets in the coma free point of the objective lens. The charged particle beam device may include a controller for controlling the operational parameters of the lens and the deflector array (e.g. a controller being connected or integrated in a feedback loop or a monitoring device for monitoring the operation of the charged particle beam device).

In particular, the deflector array may be used for shifting the z-position of the primary charged particle beamlets crossing the optical axis 4. Especially, the z-position of the primary charged particle beamlets may be shifted in cases where the coma free point of the objective lens moves along the z-axis at different imaging modes (e.g. different landing energy, signal beam extraction voltage and the like). In some embodiments, the fine adjustment of the deflector array may be used for compensating imperfections in the ray path (such as deviations from the rotational symmetry) and/or for compensating the spherical aberration of the lens (in particular, off axis beamlets are stronger focused and hit the optical axis earlier).

The individual deflectors of the deflector array may be realized by multi-pole elements, which are at least 4th order (quadrupole). According to some embodiments, the multipole elements can be manufactured by conventional mechanical machining. According to particular embodiments, which can be combined with other embodiments described herein, microelectromechanical systems (MEMS) technology deflector elements can be beneficial, because MEMS technology deflector elements allow a higher multipole density and eases the wiring of the electrodes.

According to embodiments described herein, the primary charged particle beamlets are guided through or directed in a coma free point or a coma free plane of the objective lens. As used throughout the present disclosure, the term "coma-free plane" or "coma-free point" refers to a plane or a point of (or provided by) the objective lens at which minimum or even no coma is introduced in the primary charged particle beamlets when the primary charged particle beamlets pass through the coma-free point or coma-free plane. The coma-free point or coma-free plane of the objective lens is a point or plane of the objective lens at which the Fraunhofer condition (condition that the coma is zero) is satisfied. The coma-free point or coma-free plane of the objective lens is located on a z-axis of the optical system of the charged particle beam device. The z-axis can correspond to the optical axis 4. In other words, the coma-free point of the objective lens is located on the optical axis 4. The coma-free point or coma-free plane can be positioned within the objective lens. As an example, the coma-free point or coma-free plane can be surrounded by the objective lens.

According to embodiments described herein, the primary charged particle beamlets are focused on separate locations on the specimen 140 by the objective lens 130 to simultaneously inspect the specimen at the separate locations. The objective lens may be configured for focusing the primary charged particle beamlets onto the specimen 140, wherein the objective lens is a retarding field lens. For instance, the retarding field lens may decelerate the primary charged particle beamlets to a defined landing energy. In some embodiments, the energy reduction from the column energy to the landing energy on the specimen is at least a factor of 10, for example at least a factor of 30. In one example, the landing energy is typically between about 100 eV and 8 keV, more typically 2 keV or less, e.g. 1 keV or less, such as 500 eV or even 100 eV.

According to some embodiments, the energy within the charged particle beam device changes dependent on the location in the charged particle beam device. An example is given in the following. For instance, the energy of the primary charged particle beam after the beam emitter and before the multi-aperture lens plate may be about 15 kV and is decelerated in front of the array to about 3 kV, e.g. in the configuration exemplarily shown in FIGS. 1, 2, 3*a*, and 3*b*, where the field correction electrodes are used in a decelerating mode in front of the multi-aperture lens plate. After the multi-aperture lens plate and before the lens, the energy in the column of the charged particle beam device may be about 3 kV. The lens may accelerate the primary charged particle beamlets to energy of about 15 kV in some embodiments. The landing energy of the primary charged particle beams (which are decelerated by the objective lens) may be about 300 eV in the described example.

In some embodiments, which may be combined with other embodiments described herein, the objective lens 130 may be a field compound lens. For instance, the objective lens may be a combination of a magnetic lens and an electrostatic lens. Accordingly, the objective lens may be a compound magnetic-electrostatic lens. Typically, the electrostatic part of the compound magnetic-electrostatic lens is an electrostatic retarding field lens. Using a compound magnetic-electrostatic lens yields superior resolution at low landing energies, such as a few hundred electron volts in the case of a scanning electron microscope (SEM). Low landing energies are beneficial, especially in modern semiconductor industry, to avoid charging and/or damaging of radiation sensitive specimens. The benefits of embodiments described herein may also be achieved if a magnetic lens or an electrostatic lens is used.

According to some embodiments, the primary charged particle beamlets 15 of the charged particle beam device 100 are focused on the specimen 140 by a common objective lens. According to some embodiments, which can be combined with other embodiments described herein, all of the primary charged particle beamlets pass through one opening in the objective lens 130. The specimen 140 is provided on the specimen stage 141, which can move the specimen 140 in at least one direction perpendicular to the optical axis 4.

According to embodiments described herein, the combined action of the lens and the deflector array directs the primary charged particle beamlets through the coma free point of the objective lens. The charged particle beam device and the method for inspecting a specimen with a charged particle beam device according to embodiments described herein offer a good resolution, a stable operation and at the same time low aberrations introduced by the optical elements of the charged particle beam device. In particular, the field curvature correction and the directing of the primary charged particle beamlets to the coma-free point or plane of the objective lens allow the objective lens to focus the single primary charged particle beamlets in a very precise way.

Additionally, the charged particle beam device and the method for inspecting a specimen with a charged particle beam device according to embodiments described herein provide a small spot size of the primary charged particle beamlets on the specimen. The spot size may be understood as a diameter of the area on the specimen illuminated by a single primary charged particle beamlet. For instance, the spot size of a single primary charged particle beamlet of the array of primary charged particle beamlets according to embodiments described herein may typically be less than 20 nm, more typically less than 10 nm, and even more typically less than 5 nm. According to some embodiments, the single primary charged particle beamlets may have a high current density due to the generation of the array of primary charged particle beamlets with a beam source according to embodiments described herein. The high current density helps to increase the imaging quality.

As mentioned above, the charged particle beam device according to embodiments described herein allows for providing an array of primary charged particle beamlets. According to some embodiments, the array of primary charged particle beamlets may typically include three or more primary charged particle beamlets per column, more typically ten or more primary charged particle beamlets. According to some embodiments described herein, the charged particle beam device and the method for inspecting a sample with a charged particle beam device according to embodiments described herein provide an array of primary charged particle beamlets within one column of a charged particle beam device having a small distance to each other at the sample surface. For instance, the distance between two primary charged particle beamlets within one column may typically be less than 150 μm, more typically less than 100 μm, or even less than 50 μm. The charged particle beam device and the method for inspecting a specimen with a charged particle beam device according to embodiments described herein allows to inspect very small and narrow structure on the specimen.

In some embodiments, which will be referred to in detail below, the charged particle beam device according to embodiments described herein allows to be arrayed in a multi-column microscope (MCM). Multiple columns each having an array of primary charged particle beamlets for inspecting a specimen increases the process speed and capacity.

In the recent years (and without a tendency to stop) semiconductor device structure dimensions are continuously shrinking. Accordingly, possible defects which influence the semiconductor device performance are shrinking as well. During semiconductor device manufacturing defects as large as about 10 nm are beneficial to be found with even decreasing defect sizes in future. Light optical defect inspections systems as known are running out of steam because of the limited resolution (spot size). Charged particle optical defect inspection systems, in particular electron optical defect inspection systems (EBI) have high relevance because the charged particle optical defect inspection systems can provide the resolution for inspecting small defects. Scanning electron microscopes (SEM) based tools are already used. Known tools (e.g. electron optical columns) provide limited probe currents which reduce the respective throughput significantly. Probe current limitations in known charged particle optical defect inspection systems are mainly the small aperture angle which can be used in charged particle optical defect inspection systems because of spherical and chromatic aberrations. Also, interaction between charged particles, such as electron-electron interaction, blurs the charged particle beams or beamlets at high current densities.

The known column architectures do not have the properties and the capabilities to allow the realization of a high resolution and a high current density, e.g. for multi-beam EBI tools having the sufficient throughput for scanning significant portions of a specimen (wafer, mask) in a reasonable time (a few cm$^2$/minute). The reasons are for instance that MCM configurations have pitches between columns of typically 20-60 mm. Since the pitch normally does not fit to the pitches of the die structure on the wafer, the larger number of beams is not effectively used. In some known applications, the MCM has a single column performance. If small areas (e.g. a die on a wafer) are to be inspected, multi-beamlets with small pitches (e.g. <500 μm) are beneficial. Inspection of small areas can be fulfilled e.g. by multi-beams or beamlets per column as provided by the charged particle beam device and the method for inspecting a specimen with a charged particle beam device according to embodiments described herein.

Multi-beamlet columns with deflector arrays for multi-beamlet generation are good solutions in known systems if the deflectors are arranged on a circle because of automatic field curvature correction. In other (e.g. regular square) configurations, the field curvature may limit the spot size in known systems. Also, compensation elements per single beamlet are challenging to integrate. The charged particle beam device according to embodiments described herein allows for compensating and correcting the field curvature, in particular irrespective of the array configuration of the primary charged particle beamlets.

Another reason for the limited realization of high resolution in known systems is that multi-beamlet columns with deflector arrays for multi-beamlet generation will add deflector aberration in cases in which defector array size is large. The deflector aberration influences the resolution of the possible image of the specimen. Further, multi-beamlet systems using electrostatic objective lenses (e.g. multibore Einzel lenses) as used in known systems have worse axial aberration coefficients than magnetic or combined electrostatic/magnetic lenses and inferior performance.

The above listed drawbacks of known systems are solved by the charged particle beam device and the method for inspecting a specimen with a charged particle beam device according to embodiments described herein.

Another parameter for influencing the quality of the inspection by the charged particle beam device according to embodiments described herein is the detection of the signal beams.

Figure 2:
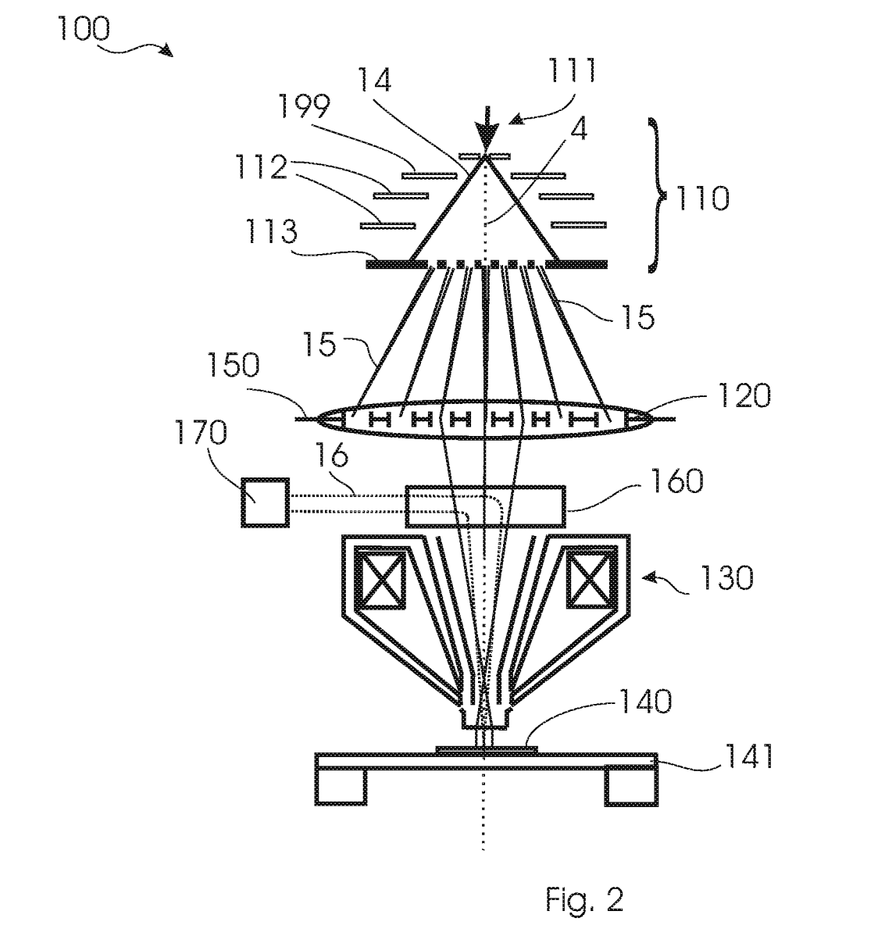
FIG. 2 shows a schematic drawing of a multi-beam device for specimen inspection according to embodiments described herein.

FIG. 2 shows a charged particle beam device 100 according to embodiments described herein. In the embodiment of the charged particle beam device as shown in FIG. 2 the primary charged particle beamlets pass a beam separator assembly 160, which is configured to separate the primary beams from secondary beams or backscattered beams, i.e. signal beams When the particles of the primary charged particle beamlets 15 strike the surface of the specimen 140 the particles undergo a series of complex interactions with the nuclei and electrons of the atoms of the specimen. The interactions produce a variety of secondary products, such as electrons of different energy, X-rays, heat, and light. Many of the secondary products are used to produce the images of the sample and to collect additional data from the specimen. The secondary products used for processing information from the specimen are referred to as signal beams 16 herein. A secondary product of major importance to examination or the image formation of specimens are secondary electrons that escape from the specimen 140 at a variety of angles with relatively low energy (1 to 50 eV).

The charged particle beam device 100 shown in FIG. 2 includes a beam separator assembly 160. The beam separator assembly 160 separates the primary charged particle beamlets 15 from the signal beams 16 (shown in dashed lines in FIG. 2). According to some embodiments, the beam separator assembly can, for example, include at least one magnetic deflector, a Wien filter, or any other means, wherein the electrons are directed away from the primary charged particle beamlets beam, e.g. due to the velocity depending Lorenz force. In some embodiments, a beam separator can be an E×B beam separator, especially an achromatic beam separator (½ E×B beam separator) as exemplarily shown in FIG. 3a, a 2-B separator (as exemplarily shown in FIG. 3b), i.e. a beam separator with 2 magnetic fields, a 2-B separator with dispersion correction, a 2-B separator with a tilted upper part of the column for dispersion correction (as will be shown in FIG. 3a), or any of the above-mentioned 2-B separators having e.g. an additional signal electron bender to increase the bending angle of the signal beam 16 (e.g. to 45° to 90°). The secondary particles or signal particles are extracted from the specimen through the objective lens 130, are separated from the primary charged particle beamlets 15 in the beam separator assembly 160, and reach a detector assembly 170.

The detector assembly 170 includes one or more detector elements, which are configured for generation of a measurement signal, e.g. an electronic signal corresponding to the detected signal particles. According to some embodiments, the detector assembly may be a multi-channel detector for detecting the signal particles or signal beams generated by the interaction of the specimen with the primary charged particle beamlets.

By scanning the primary charged particle beamlets 15 over the specimen 140 and displaying/recording the output of the detector assembly 170 or detector elements, multiple independent images of the surface of the specimen 140 are generated. Each image contains information about a different portion of the surface of the specimen. The information carried by the signal beam can include information about the topography of the specimen, the chemical constituents, the electrostatic potential, and others.

As mentioned above and according to some embodiments, the charged particle beam device may include a beam bender for deflecting the signal beams. In some embodiments the beam bender includes at least two curved electrodes. The curved electrodes can be electrodes curved in one direction. According to another embodiment, the beam bender can be a hemispherical beam bender. According to some embodiments, the beam bender may be a hexapole-free beam bender or hexapole corrected bender. The hexapole-free or hexapole corrected beam bender can reduce or compensate a hexapole component of electric fields by providing at least one of differently shaped electrodes and an aperture having a substantially triangular shaped passage area for the signal beam.

According to some embodiments, the hexapole-free bender may be a signal charged particle deflection device for a charged particle beam device. In some embodiments, the hexapole-free bender may include a beam bender configured for deflecting the signal beam, wherein the beam bender includes a first electrode and a second electrode providing an optical path for the signal beam there between. The first electrode may have a first cross section in a plane perpendicular to the optical path, and the second electrode may have a second cross section in the plane perpendicular to the optical path. A first part of the first cross section and a second part of the second cross section may provide the optical path there between, wherein the first part and the second part may be different in shape. According to some embodiments, the first part of the first cross section may be defined by a polynomial. In some embodiments, the second part of the second cross section is defined by an exponential function. The hexapole-free beam bender or the hexapole corrected beam bender can in particular reduce or compensate at least one of a hexapole component between two electrodes of the beam bender and the hexapole component of fringe fields e.g. at at least one of an entrance and exit of the beam bender. The beam bender as described herein may also be referred to as "low hexapole signal charged particle deflection device". The charged particle beam device 100 according to embodiments described herein may include additional elements of secondary electron optics. For instance, in order to inspect defects as fast as possible, the contrast needs to be increased.

A charged particle beam device according to embodiments described herein may have a high signal detection efficiency of >50% of signal particle capture rate. High signal detection efficiency can be considered as being as relevant as high primary charged particle beam (or beamlet) performance. An on-axis (i.e. optical axis 4) detection of the signal beam has limited performance since the primary charged particle beam and signal beam ray path are beneficially optimized simultaneously, which results in restrictions. The separation of primary charged particle beams and signal beams (eventually including signal beam optical elements) is a solution in which both ray paths can be treated (and optimized) independently from each other.

Figure 3A:
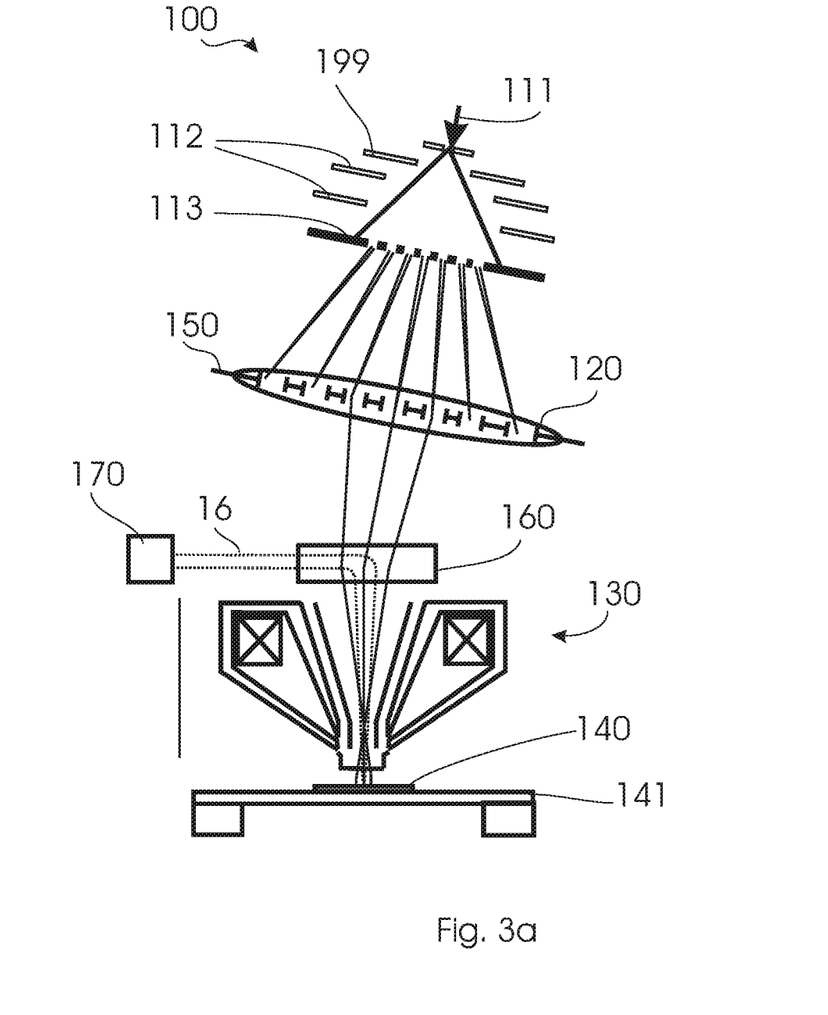
FIG. 3a shows a schematic drawing of a multi-beam device for specimen inspection according to embodiments described herein.

FIG. 3a shows an embodiment of a charged particle beam device 100. The charged particle beam device 100 as shown in FIG. 3a has a tilted upper part of the column for dispersion correction. With a tilted upper part of the column (i.e. the part of the column upstream of the beam separator assembly 160, when seen in the direction of the propagating primary charged particle beamlets 15), the beam separator assembly 160 is achromatic without additional dispersion correction (e.g. by the application of an additional electrostatic field).

Figure 3B:
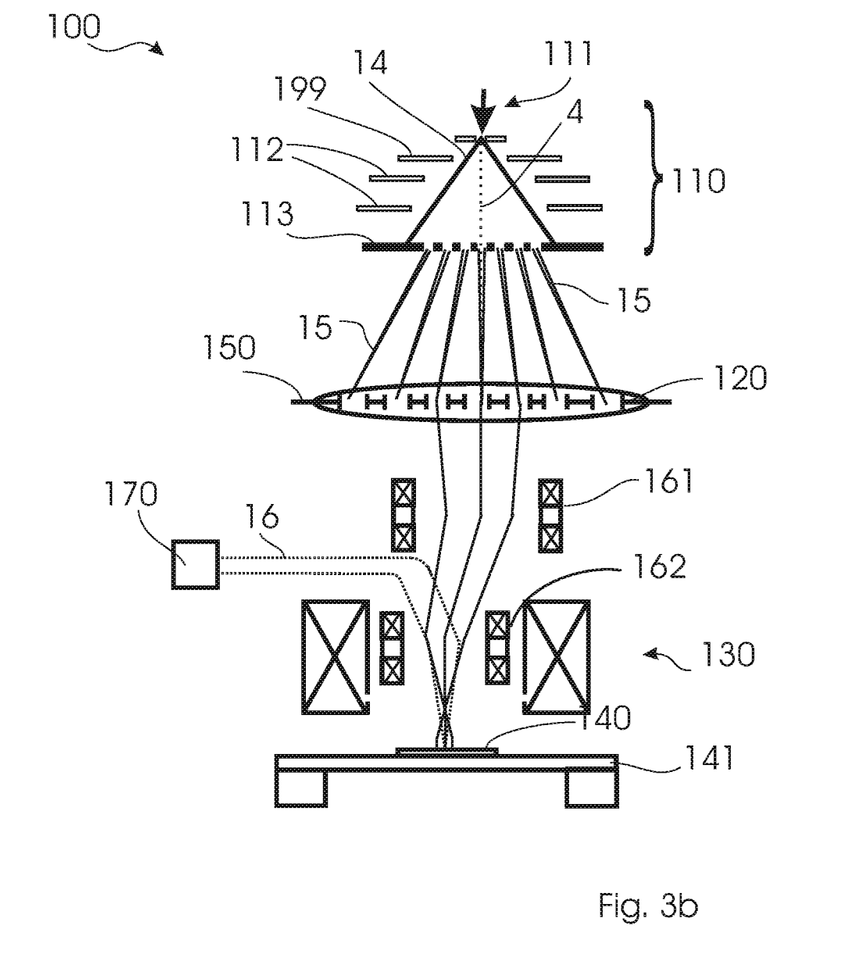
FIG. 3b shows a schematic drawing of a multi-beam device for specimen inspection according to embodiments described herein.

FIG. 3b shows an embodiment of a charged particle beam device 100. In the example shown in FIG. 3b, the charged particle beam device 100 includes a 2B-beam separator for separating the primary charged particle beamlets 15 from the signal beams 16. According to some embodiments, the beam separator shown in FIG. 3b includes a first magnetic beam separator deflection coil 161 and a second magnetic beam separator deflection coil 162. In the embodiment of FIG. 3b, the objective lens 130 is shown as a magnetic objective lens.

According to some embodiments described herein, the charged particle beam device may include further beam optical elements, such as condenser lenses, (scanning) deflectors, beam benders, correctors, or the like. In some embodiments, a condenser lens may be placed before the multi-aperture lens plate (i.e. upstream of the primary charged particle beam when seen in a direction of the propagating primary charged particle beam). The charged particle beam device according to embodiments described herein may include a beam blanker, such as an individual beam blanker for each beamlet or a common beam blanker with a blanker aperture typically before the beam separator looking from the particle beam emitter.

Figure 4:
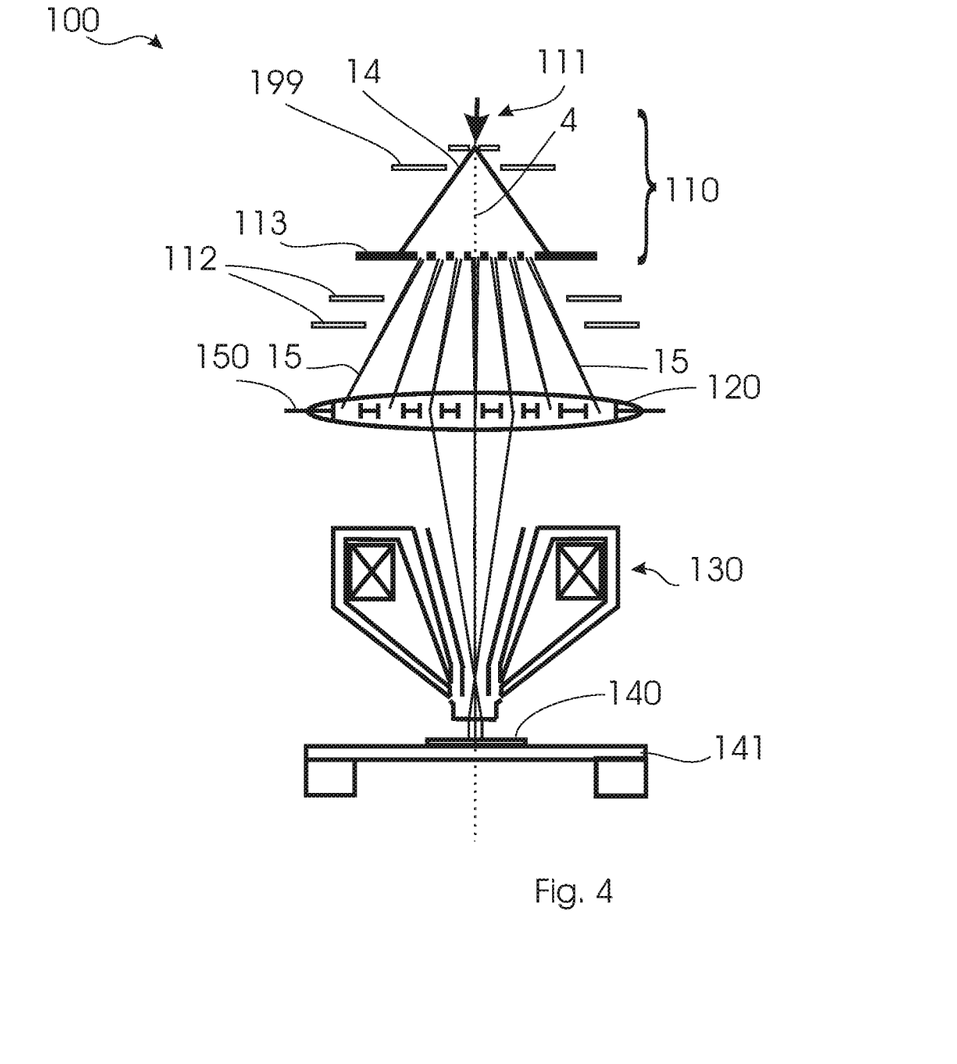
FIG. 4 shows a schematic drawing of a multi-beam device for specimen inspection according to embodiments described herein.

FIG. 4 shows an embodiment of a charged particle beam device 100. The charged particle beam device 100 includes a charged particle beam source 110 having a charged particle beam emitter 111 and an acceleration electrode 199 (for providing a voltage difference between the charged particle beam emitter 111 and the acceleration electrode 199). The charged particle beam device 100 as exemplarily shown in FIG. 4 includes a multi-aperture lens plate 113 for dividing the primary charged particle beam 14 emitted from the charged particle beam emitter 111 into several primary charged particle beamlets 15. According to some embodiments, the multi-aperture lens plate 113 may be a multi-aperture lens plate as described in embodiments before, such as in embodiments described with reference to FIGS. 1, 2, 3, and 3b. The charged particle beam device 100 further includes field curvature correction electrodes 112. In the embodiment shown in FIG. 4, the field curvature correction electrodes 112 are positioned behind the multi-aperture lens plate 113, especially when seen in a direction of the propagating primary charged particle beamlets 15.

In some embodiments, the field curvature correction electrodes of FIG. 4 are adapted to be driven in an acceleration mode. For instance, the field curvature correction electrodes may be connected to a controller for controlling the voltage supply to the field curvature correction electrodes. According to some embodiments, the field curvature correction electrodes being in acceleration mode may accelerate the primary charged particle beam or the primary charged particle beamlets propagating from the aperture lens plate.

In some embodiments, the lens 120 as shown in FIG. 4 may be a magnetic lens, a rotation free magnetic lens, a rotation free magnetic lens doublet, an electrostatic lens (e.g. with the possibility to decelerate or accelerate the primary charged particle beamlets), and/or a combined electrostatic-magnetic lens (e.g. with an acceleration function for the primary charged particle beamlets). In some embodiments, the lens may be a magnetic lens allowing easy mechanical access to the center (and e.g. the deflector array location). According to some embodiments, the lens 120 provides the main directing effect for directing the charged particle beamlets to a coma free of the objective lens 130. The fine tuning of the directing may be made with a deflector array 150 within the lens 120. The focusing of the primary charged particle beamlets, the beam separation between primary charged particle beamlets and signal beams or beamlets, and the signal detection may be the same as described in detail with respect to FIGS. 1, 2, 3a, and 3b. Features described with respect to 1, 2, 3a, and 3b may also be used in the embodiment shown in FIG. 4 as long as the features do not contradict each other.

Figure 5:
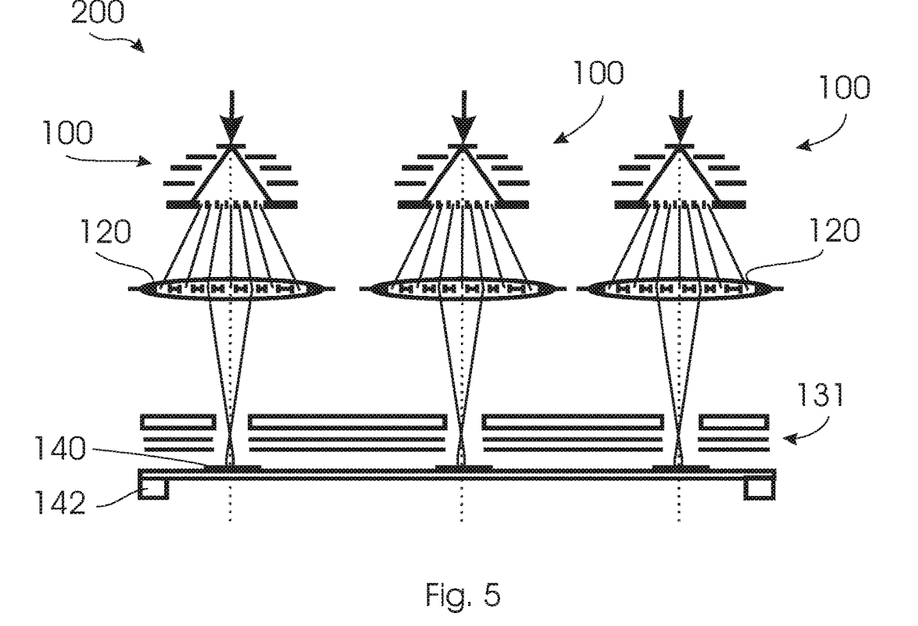
FIG. 5 shows a schematic drawings of a multi-beam device for specimen inspection according to embodiments described herein.

FIG. 5 shows a multi-column microscope configuration 200. The multi-column microscope configuration 200 is exemplarily shown with three charged particle beam devices 100. The number of charged particle beam device may deviate from the shown example in multi-column microscope configuration according to embodiments described herein. For instance, a multi-column microscope configuration according to embodiments described herein may have less than three charged particle beam devices, such as two, or more than three charged particle beam devices, such as four, five, or even more than five. Each of the charged particle beam devices of the multi-column microscope configuration may be a charged particle beam device as described in any embodiments described herein, in particular with respect to FIGS. 1 to 4. In the exemplary view of FIG. 5, the multi-column microscope includes charged particle beam devices as shown and described in FIG. 1. The multi-column microscope configuration 200 includes a specimen stage 142, on which several specimens 140 to be inspected are placed. In some embodiments, the charged particle beam devices of the multi-column microscope configuration 200 may inspect one specimen together.

According to some embodiments described herein, the charged particle beam devices 100 of the multi-column microscope configuration 200 may have a common objective lens 131 (shown in a simplified schematic view) including electrostatic lens components and magnetic lens components e.g. a magnetic lens with multiple bores and common excitation coil. The electrostatic lens component may include an upper electrode, which lies on a high potential and a lower electrode, which lies on a potential close to the specimen voltage and which decelerates the electrons for providing the landing energy. The electrodes contribute to directing the primary charged particle beamlets, as well as to slowing down the primary charged particle beamlets. Additionally a control electrode, e.g. a proxi-electrode, for extracting the signal particles, such as secondary electrons (SE) or backscattered electrons, may be provided. For instance, with the objective lens according to embodiments described herein, the very low landing energy, e.g. 100 eV and a low extraction field, can be provided without deteriorating overall performance of the charged particle beam imaging system.

The charged particle beam device and the multi-column microscope configuration according to embodiments described herein can be described as being flexible in operation conditions (e.g. the landing energy of the primary charged particle beamlets, the extraction voltage of the signal beams) without significant performance loss, in particular due to the low aberrations of the charged particle beam device according to embodiments described herein.

Although the objective lens having a lower electrode, a middle electrode and an upper electrode, as well as eventually a proxi electrode, are described with respect to the multi-column microscope configuration, the described electrodes may also be used (together or alone) for an objective lens in a single charged particle beam device as described in embodiments herein, and in particular with respect to FIGS. 1 to 4.

In some embodiments, a common objective lens for the primary charged particle beamlets (e.g. a magnetic lens) may include at least two lens modules, each including a first pole piece, a second pole piece and at least one opening for a primary charged particle beamlet. Additionally, the common objective lens may include at least one excitation coil providing a magnetic flux to the at least two lens modules. According to some embodiments, the common objective lens may include a lens module for each primary charged particle beamlet.

According to some embodiments, the charged particle beam devices 100 of the multi-column microscope configuration may have a distance to each other of typically between about 10 mm to about 60 mm, more typically between about 10 mm and about 50 mm. In some embodiments, the distance between the single charged particle beam devices of the multi-column microscope configuration may be measured as distance between the optical axes of the charged particle beam devices.

By using several charged particle beam devices in a multi-column microscope configuration as exemplarily shown in FIG. 5, a sufficient number of primary charged particle beamlets can be provided at a sufficient resolution and with a sufficiently small crosstalk between signal beamlets.

Figure 6:
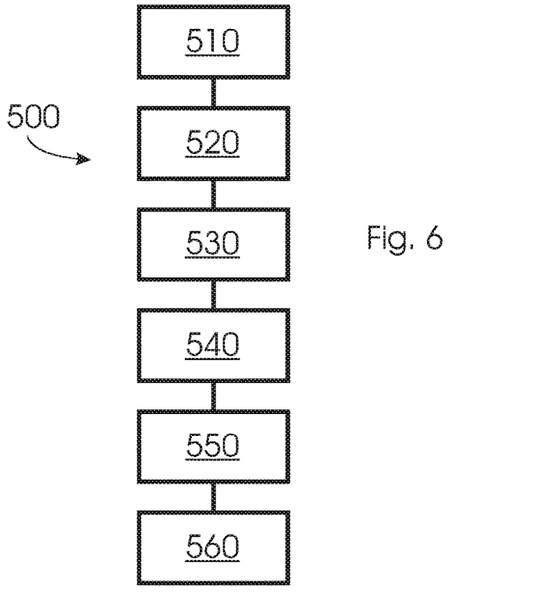
FIG. 6 shows a flow chart of a method for inspecting a specimen with a charged particle beam device according to embodiments described herein.

According to some embodiments, a method for inspecting a specimen with an array of primary charged particle beamlets in a charged particle beam device is described. In FIG. 6, a flowchart 500 of the method for inspecting is shown. According to some embodiments, which may be combined with other embodiments described herein, the charged particle beam device as used in the method may be a charged particle beam device as described in embodiments herein, especially with respect to FIGS. 1 to 4. The method according to embodiments described herein may also be performed with a multi-column microscope configuration as described in some embodiments, such as the embodiment shown in FIG. 5.

In block 510, the method according to embodiments described herein includes the generation of a primary charged particle beam with a charged particle beam source including a beam emitter. The beam emitter may for instance be a source may be a CFE, a Schottky emitter, a TFE or another high current—high brightness charged particle beam source (such as an electron beam source), as e.g. mentioned above. According to some embodiments, the beam emitter may emit one primary charged particle beam, which may be processed (e.g. by being split up by a multi-aperture lens) so that a plurality of primary charged particle beamlets are generated. The beamlets are directed behind the multi-aperture lens to the plane of a lens (which may be an acceleration lens in some embodiments). According to some embodiments, which may be combined with other embodiments described herein, the beam emitter may include extraction electrodes for supporting (and directing) the extraction of the charged particles from the beam emitter.

In block 520, the method further includes correcting a field curvature of the charged particle beam device with at least two electrodes. The field curvature to be corrected by the electrodes may be introduced to the charged particle beam device by the imaging lenses, such as the objective lens of the charged particle beam device, as described in detail above. Together with the multi-aperture lens plate and the extractor electrodes, the field curvature correction electrodes and the extraction electrode may create a so called "zero-strength macro lens". "Zero strength" may mean that the off-axis charged particles are not deflected, avoiding the problem associated with chromatic deflection errors. According to some embodiments, the field curvature correction electrodes may be configured and/or controlled so that the field from the field curvature correction electrodes may end on the multi-aperture lens plate, forming low aberration single aperture lenses for the single primary charged particle beamlets.

According to embodiments described herein, the at least two field curvature correction electrodes may have aperture openings through which the primary charged particle beam passes. In some embodiments, the method includes controlling and/or adjusting the field curvature electrodes to the intended application, to the lenses used in the charged particle beam device, and to other suitable operation parameters of the charged particle beam device. In some embodiments, the field curvature correction electrodes may be driven in acceleration or deceleration mode. For instance, the field curvature correction electrodes may have a decelerating effect, when arranged in front of the multi-aperture lens plate (in a direction of the propagating primary charged particle beam). In one example, the field curvature correction electrodes may have a accelerating effect, when arranged behind the multi-aperture lens plate (in a direction of the propagating primary charged particle beam).

In block 530, the method includes illuminating the multi-aperture lens plate with the primary charged particle beam to generate an array of primary charged particle beamlets. For instance, the multi-aperture lens plate may have a plurality of aperture openings, which result in the primary charged particle beam being split into several focused primary charged particle beamlets. The grid configuration or the arrangement of the aperture openings of the multi-aperture lens plate may be suitably chosen, as described and discussed in detail above. For instance, the aperture openings in the multi-aperture lens plate may be arranged so as to 1-dimensional beamlet array, or a 2-dimensional beamlet array, such as—for instance—a rectangular or quadratic beamlet array.

According to embodiments described herein, the method includes in block 540 directing the primary charged particle beamlets generated by the charged particle beam source to a coma-free point of the objective lens. In one embodiment, the lens may be an accelerator lens (e.g. in the case where the field curvature correction electrodes are arranged in front of the multi-aperture lens plate). As described above, the acceleration lens may accelerate the primary charged particle beamlets leaving the multi-aperture lens plate to energy of about 10 kV to about 30 kV. The booster energy provided by the acceleration lens may reduce electron-electron interaction in the common crossover of the primary charged particle beamlets.

In block 550, the primary charged particle beamlets are guided through a deflector array arranged within or near the lens. In some embodiments, the deflector array may be arranged within the focal length of the lens or within the electrodes of the lens. According to embodiments described herein, the combined action of the lens and the deflector array directs the primary charged particle beamlets through a coma free point of the objective lens of the charged particle beam device. In block 560, the primary charged particle beamlets are focused on separate locations on the specimen with the objective lens to simultaneously inspect the specimen at the separate locations. According to some embodiments, the field curvature correction and the passage of the primary charged particle beamlets through the coma-free point of the objective lens allows the objective lens focusing the primary charged particle beamlets in a precise way onto the specimen with reduced or very low aberrations.

According to some embodiments, the method may further include applying a voltage to a proxi electrode near to the objective lens (such as between the specimen and the objective lens) for facilitating the extraction signal particles or signal beams from the specimen. The signal beam may be separated from the primary charged particle beamlets by a beam separator, especially an achromatic beam separator. In some embodiments, the signal beam is bent by a beam bender to direct the signal beam to a detector assembly, especially an off-axis detector assembly. The method may further include detecting the signal beam by the detector assembly, and in particular by a multi-channel detector assembly.

In some embodiments, the method may include processing the data obtained by the detector for generating an image of the specimen, or for having the data in a format allowing evaluating the structure of the specimen.

The present disclosure provides a plurality of embodiments. Exemplary embodiments are listed below. Embodiment 1: A method for inspecting a specimen with an array of primary charged particle beamlets in a charged particle beam device having an optical axis extending in z-direction of the charged particle beam device is provided. The method includes generating a primary charged particle beam with a charged particle beam emitter; illuminating a multi-aperture lens plate having a surface with the primary charged particle beam to generate the array of primary charged particle beamlets which are focused; generating an electrical field by at least a first electrode on the surface of the multi-aperture lens plate; wherein a field component in z-direction of the electrical field provided by the at least first electrode is non-rotational-symmetric; and focusing the primary charged particle beamlets on separate locations on the specimen with an objective lens to simultaneously inspect the specimen at the separate locations.

Embodiment 2: The method according to embodiment 1, wherein the at least first electrode is arranged before the aperture lens plate in direction of the propagating primary charged particle beamlets.

Embodiment 3: The method according to embodiment 1, wherein the at least first electrode is arranged after the aperture lens plate in direction of the propagating primary charged particle beamlets.

Embodiment 4: The method according to any of embodiments 1 to 3, wherein a non-rotational-symmetric z-component of the electrical field provided by the at least first electrode is provided by the at least first electrode being segmented in circumferential direction into at least two separate electrode segments.

Embodiment 5: The method according to embodiment 4, wherein the at least first electrode is segmented provides a dipole, a quadrupole or a pole of higher order.

Embodiment 6: The method according to any of embodiments 1 to 5, wherein a non-rotational-symmetric z-component of the electrical field provided by the at least first electrode is provided by the at least first electrode being tilted with respect to a plane being perpendicular to the optical axis of the charged particle beam device.

Embodiment 7: The method according to any of embodiments 1 to 6, further comprising: measuring a sample tilt or a local sample tilt of the specimen; and generating the electrical field with a field strength in proportion to that tilt or with a field strength to at least partially compensate the sample tilt or the local sample tilt.

Embodiment 8: The method according to any of embodiments 1 to 7, further including scanning the primary charged particle beamlets over the specimen by a scan deflector, wherein a z-component of the electrical field generated by the at least first electrode on the surface of the multi-aperture lens plate has an amplitude proportional to an excitation of the scan deflector.

Embodiment 9: A charged particle beam device for inspection of a specimen with an array of primary charged particle beamlets, the charged particle beam device including an optical axis extending in z-direction of the charged particle beam device and further including: a charged particle beam source for generating an array of primary charged particle beamlets, wherein the charged particle beam source includes: a charged particle beam emitter for emitting a charged particle beam; a multi-aperture lens plate having a surface, the multi-aperture lens plate including at least two openings to generate and focus an array of primary charged particle beamlets, the multi-aperture lens plate being arranged for being illuminated with the primary charged particle beam. The charged particle beam device further includes at least a first electrode for generating an electrical field on the surface of the multi-aperture lens plate; the at least first electrode having a radial direction, a circumferential direction and an aperture opening through which the primary charged particle beam or the primary charged particle beamlets pass; wherein the at least first electrode is segmented in circumferential direction into at least two separate electrode segments; and an objective lens for focusing each primary charged particle beamlet of the array of primary charged particle beamlets to a separate location on the specimen.

Embodiment 10: The charged particle beam device according to embodiment 9, wherein the separate electrode segments are separately biasable with different voltages.

Embodiment 11: The charged particle beam device according to any of embodiments 9 to 10, wherein the first electrode being segmented provides a dipole, a quadrupole or a pole of higher order.

Embodiment 12: The charged particle beam device according to any of embodiments 9 to 11, wherein the at least first electrode is arranged before the aperture lens plate in direction of the propagating primary charged particle beamlets.

Embodiment 13: The charged particle beam device according to any of embodiments 9 to 11, wherein the at least first electrode is arranged after the aperture lens plate in direction of the propagating primary charged particle beamlets.

Embodiment 14: The charged particle beam device according to any of embodiments 9 to 13, further including a scan deflector for scanning the primary charged particle beamlets over the specimen.

Embodiment 15: The charged particle beam device according to any of embodiments 9 to 14, wherein the at least first electrode is tilted with respect to a plane being perpendicular to the optical axis of the charged particle beam device.

Embodiment 16: A charged particle beam device for inspection of a specimen with an array of primary charged particle beamlets, the charged particle beam device including an optical axis extending in z-direction of the charged particle beam device and further including: a charged particle beam source for generating an array of primary charged particle beamlets, wherein the charged particle beam source includes: a charged particle beam emitter for emitting a charged particle beam; a multi-aperture lens plate including at least two openings to generate and focus an array of primary charged particle beamlets, the multi-aperture lens plate being arranged for being illuminated with the primary charged particle beam. The charged particle beam device further includes at least a first electrode for generating an electrical field on a surface of the multi-aperture lens plate; the at least first electrode having aperture openings through which the primary charged particle beam or the primary charged particle beamlets pass; wherein the at least first electrode is tilted with respect to a plane being perpendicular to the optical axis of the charged particle beam device; and an objective lens for focusing each primary charged particle beamlet of the array of primary charged particle beamlets to a separate location on the specimen.

Embodiment 17: The charged particle beam device according to embodiment 16, wherein the first electrode is tilted in x- or y-direction being both perpendicular to the z-direction.

Embodiment 18: The charged particle beam device according to any of embodiments 16 to 17, wherein the first electrode is arranged before the aperture lens plate in direction of the propagating primary charged particle beamlets.

Embodiment 19: The charged particle beam device according to any of embodiments 16 to 17, wherein the first electrode is arranged after the aperture lens plate in direction of the propagating primary charged particle beamlets.

Embodiment 20: The charged particle beam device according to any of embodiments 16 to 19, wherein the first electrode is segmented in circumferential direction into at least two separate electrode segments.

Embodiment 21: The charged particle beam device according to any of embodiments 16 to 20, wherein the charged particle beam device is adapted for supporting the specimen in a tilted manner.

Embodiment 22: A multi-column microscope for inspection of a specimen, including: a charged particle beam device for inspection of a specimen with an array of primary charged particle beamlets, the charged particle beam device including an optical axis extending in z-direction of the charged particle beam device and further including: a charged particle beam source for generating an array of primary charged particle beamlets, wherein the charged particle beam source includes: a charged particle beam emitter for emitting a charged particle beam; a multi-aperture lens plate including at least two openings to generate and focus an array of primary charged particle beamlets, the multi-aperture lens plate being arranged for being illuminated with the primary charged particle beam; at least a first electrode for generating an electrical field on a surface of the multi-aperture lens plate; the at least first electrode having aperture openings through which the primary charged particle beam or the primary charged particle beamlets pass, wherein the at least first electrode is tilted with respect to a plane being perpendicular to the optical axis of the charged particle beam device and/or wherein the at least first electrode is segmented in circumferential direction into at least two separate electrode segments; and the charged particle beam device further includes an objective lens for focusing each primary charged particle beamlet of the array of primary charged particle beamlets to a separate location on the specimen. The multi column microscope further includes: a further charged particle beam source for generating a further array of primary charged particle beamlets.

Embodiment 23: The charged particle beam device according to any of embodiments 9 to 15, further including: at least one of a lens module and a deflector module to guide primary charged particle beamlets of the array of primary charged particle beamlets through a coma-free point of the objective lens.

Embodiment 24: The charged particle beam device according to any of embodiments 16 to 21, further including: at least one of a lens module and a deflector module to guide primary charged particle beamlet of the array of primary charged particle beamlets through a coma-free point of the objective lens.

Embodiment 25: The multi column microscope according to embodiment 22, further including: at least one of a lens module and a deflector module to guide primary charged particle beamlet of the array of primary charged particle beamlets through a coma-free point of the objective lens.

Embodiment 26: The multi column microscope according to embodiment 22 or 25, further including: a collimator having at least one of collimator lens and a deflector array to guide the primary charged particle beamlet of the array of primary charged particle beamlets to the respective optical axis of an objective lens array.

Embodiment 27: The multi column microscope according to embodiment 26, wherein the objective lens array includes one or more of individual electrostatic lenses and individual magnetic lenses.

Embodiment 28: The multi column microscope according to embodiment 27, wherein the individual electrostatic lenses are retarding field lenses.

Embodiment 29: The multi column microscope according to embodiment 27 or 28, wherein the individual magnetic lenses have a common excitation coil.

While the foregoing is directed to embodiments, other and further embodiments may be devised without departing from the basic scope thereof, and the scope thereof is determined by the claims that follow.

What is claimed is:

1. A method of inspecting a specimen with an array of primary charged particle beamlets in a charged particle beam device,
    generating a primary charged particle beam with a charged particle beam emitter of a charged particle beam source;
    illuminating a multi-aperture lens plate with the primary charged particle beam to generate the array of primary charged particle beamlets which are focused;
    correcting a field curvature of the charged particle beam device with at least two electrodes, wherein the at least two electrodes comprise aperture openings;
    directing the array of primary charged particle beamlets with a lens towards an objective lens of the charged particle beam device;
    guiding the array of primary charged particle beamlets through a deflector array arranged within the lens; wherein the combined action of the lens and the deflector array directs the array of primary charged particle beamlets through a coma free point of the objective lens of the charged particle beam device; and
    focusing the array of primary charged particle beamlets on separate locations on the specimen with the objective lens to simultaneously inspect the specimen at the separate locations.

2. The method according to claim 1, wherein correcting the field curvature of the charged particle beam device with at least two electrodes comprises placing the at least two electrodes between the charged particle beam source and the multi-aperture lens plate.

3. The method according to claim 1, wherein correcting a field curvature of the charged particle beam device with the at least two electrodes comprises operating the at least two electrodes in deceleration mode decelerating the primary charged particle beam or the array of primary charged particle beamlets.

4. The method according to claim 1, wherein correcting the field curvature of the charged particle beam device with at least two electrodes comprises placing the at least two electrodes behind the multi-aperture lens plate in a direction of propagation of the array of primary charged particle beamlets.

5. The method according to claim 1, wherein correcting a field curvature of the charged particle beam device with the at least two electrodes comprises operating the at least two electrodes in acceleration mode accelerating the primary charged particle beam or the array of primary charged particle beamlets.

6. The method according to claim 1, wherein the lens is chosen from the group consisting of: an electrostatic lens, a combined electrostatic-magnetic lens, a magnetic lens, and a rotation-free magnetic lens doublet.

7. The method according to claim 1, wherein signal charged particle beamlets are generated on impingement or backscattering of the array of primary charged particle beamlets on the specimen, and wherein the signal charged particle beamlets are separated from the array of primary charged particle beamlets by a magnetic field of a beam separator arranged between the lens and the objective lens.

8. The method according to claim 1, wherein the deflector array comprises a plurality of quadrupole elements for individually aligning the array of primary charged particle beamlets.

9. The method according to claim 1, wherein the array of primary charged particle beamlets includes at least three primary charged particle beamlets.

10. The method according to claim 1, further comprising impinging of the array of primary charged particle beamlets on the specimen, wherein each of the primary charged particle beamlets provides a spot on the specimen, the spot having a spot size of less than 20 nm.

11. The method according to claim 1, further comprising impinging of the array of primary charged particle beamlets on the separate locations of the specimen, wherein the smallest distance between any of the charged particle beamlets of the array of primary charged particle beamlets on impingement on the specimen is less than 150 μm.

12. A charged particle beam device for inspection of a specimen with an array of primary charged particle beamlets, the charged particle beam device comprising:
    a charged particle beam source for generating the array of primary charged particle beamlets, wherein the charged particle beam source comprises:
        a charged particle beam emitter for emitting a primary charged particle beam,
        a multi-aperture lens plate comprising at least two openings to generate and focus the array of primary charged particle beamlets, the multi-aperture lens plate being arranged for being illuminated with the primary charged particle beam;
a field curvature correction device for correcting a field curvature of the charged particle beam device, wherein the field curvature correction device comprises at least two field curvature correction electrodes having aperture openings through which the primary charged particle beam or the array of primary charged particle beamlets pass;
a lens configured for directing the array of primary charged particle beamlets to an objective lens of the charged particle beam device;
a deflector array arranged within the lens, wherein the lens and the deflector array are configured for directing the array of primary charged particle beamlets through a coma free point of an objective lens by the combined action of the lens and the deflector array; and
an objective lens for decelerating and focusing each primary charged particle beamlet of the array of primary charged particle beamlets to a separate location on the specimen.

13. The charged particle beam device according to claim 12, wherein the field curvature correction device is placed between the charged particle beam emitter and the multi-aperture lens plate.

14. The charged particle beam device according to claim 12, wherein the field curvature correction device is placed behind the multi-aperture lens plate in a direction of propagation of the array of primary charged particle beamlets.

15. The charged particle beam device according to claim 12, wherein the lens is placed directly after the multi-aperture lens plate in a direction of propagation of the array of primary charged particle beamlets.

16. The charged particle beam device according to claim 12, wherein the lens is chosen from the group consisting of: an electrostatic lens, a combined electrostatic-magnetic lens, a magnetic lens, and a rotation-free magnetic lens doublet.

17. The charged particle beam device according to claim 12, wherein each of the primary charged particle beamlets of the array of primary charged particle beamlets provides a spot on the specimen, the spot having a spot size of less than 20 nm.

18. The charged particle beam device according to claim 12, further comprising a beam separator for separating the array of primary charged particle beamlets from signal charged particle beamlets generated upon impingement or backscattering of the array of primary charged particle beamlets on or from the specimen.

19. A multi-column microscope configuration with at least two charged particle beam devices configured to image a specimen, each of the at least two charged particle beam devices comprising:
a charged particle beam source for generating an array of primary charged particle beamlets, wherein the charged particle beam source comprises:
a charged particle beam emitter for emitting a primary charged particle beam,
a multi-aperture lens plate comprising at least two openings to generate an array of primary charged particle beamlets, the multi-aperture lens plate being arranged for being illuminated with the primary charged particle beam;
a field curvature correction device for correcting a field curvature of the charged particle beam device, wherein the field curvature correction device comprises at least two field curvature correction electrodes having aperture openings through which the primary charged particle beam passes;
a lens configured for directing the array of primary charged particle beamlets towards an objective lens of the charged particle beam device; and
a deflector array arranged within the lens; wherein the lens and the deflector array are configured for directing the array of primary charged particle beamlets through a coma free point of an objective lens by the combined action of the lens and the deflector array; and
an objective lens for decelerating and focusing each primary charged particle beamlet of the array of primary charged particle beamlets to a separate location on the specimen.

20. The multi-column microscope configuration according to claim 19, wherein the objective lens of the at least two charged particle beam devices comprises at least two lens modules, each lens module including a first pole piece, a second pole piece and at least one opening for a primary charged particle beamlet of the array of primary charged particle beamlets, and wherein the objective lens further comprises at least one excitation coil providing a magnetic flux to the at least two lens modules.

* * * * *